(12) United States Patent
Xu et al.

(10) Patent No.: US 10,944,390 B2
(45) Date of Patent: Mar. 9, 2021

(54) HIGH-SPEED AND LOW-NOISE DYNAMIC COMPARATOR

(71) Applicant: NO.24 RESEARCH INSTITUTE OF CHINA ELECTRONICS TECHNOLOGY GROUP CORPORATIO, Chongqing (CN)

(72) Inventors: Daiguo Xu, Chongqing (CN); Gangyi Hu, Chongqing (CN); Ruzhang Li, Chongqing (CN); Jian'an Wang, Chongqing (CN); Guangbing Chen, Chongqing (CN); Dongbing Fu, Chongqing (CN); Shiliu Xu, Chongqing (CN); Tao Liu, Chongqing (CN); Jie Pu, Chongqing (CN); Zhihua Feng, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 16/620,526

(22) PCT Filed: Jul. 18, 2018

(86) PCT No.: PCT/CN2018/096084
§ 371 (c)(1),
(2) Date: Mar. 29, 2020

(87) PCT Pub. No.: WO2019/178988
PCT Pub. Date: Sep. 26, 2019

(65) Prior Publication Data
US 2020/0412353 A1 Dec. 31, 2020

(30) Foreign Application Priority Data

Mar. 22, 2018 (CN) .......................... 201810239481.X

(51) Int. Cl.
H03K 5/22 (2006.01)
H03K 5/24 (2006.01)
H03K 19/20 (2006.01)

(52) U.S. Cl.
CPC .......... H03K 5/2481 (2013.01); H03K 5/249 (2013.01); H03K 19/20 (2013.01)

(58) Field of Classification Search
CPC .... H03K 5/2481; H03K 5/249; H03K 5/2418; H03K 3/037; H03K 3/012;
(Continued)

(56) References Cited

U.S. PATENT DOCUMENTS 8,164,361 B2 * 4/2012 Soltanian ......... H03K 3/356156
326/113
8,970,272 B2 * 3/2015 Zhang ................ H03K 3/35625
327/208

(Continued)

FOREIGN PATENT DOCUMENTS

| CN | 102957405 A | 12/2015 |
| CN | 105162441 A | 12/2015 |
| CN | 107493093 A | 12/2017 |

*Primary Examiner* — Quan Tra

(57) ABSTRACT

The present disclosure provides a high-speed and low-noise dynamic comparator, which includes: an input unit, including an input NMOS transistor and an input PMOS transistor; a latch unit, including a latching NMOS transistor and a latching PMOS transistor, where the latching NMOS transistor and the latching PMOS transistor are connected to form a latch structure; a pull-up unit, including a pull-up PMOS transistor connected to the input NMOS transistor; and a substrate bootstrap voltage generation circuit, generating a substrate bootstrap voltage. In the present disclosure, a substrate bootstrap technology of MOS transistors is used, thereby reducing on resistances of the MOS transistors and improving the comparator speed; threshold voltages of the input transistors of the comparator are reduced, transcon- (Continued)

ductance of the input transistors is increased, thereby reducing equivalent input noise of the comparator, and as a common-mode voltage of the comparator changes, a comparison delay changes relatively little.

6 Claims, 3 Drawing Sheets

(58) Field of Classification Search
CPC ........... H03K 3/356121; H03K 3/0375; H03K 3/356139; H04L 25/0272; H03F 3/45183
USPC .................................... 327/55, 65, 208, 218
See application file for complete search history.

(56) References Cited

U.S. PATENT DOCUMENTS

| | | | |
|---|---|---|---|
| 10,305,500 B1* | 5/2019 | Jung | H03K 3/356095 |
| 2001/0005159 A1* | 6/2001 | Matsumoto | H01L 27/0629 |
| | | | 327/536 |
| 2008/0143423 A1* | 6/2008 | Komatsu | H01L 27/1203 |
| | | | 327/534 |
| 2010/0245149 A1 | 9/2010 | Danjo et al. | |
| 2011/0267145 A1 | 11/2011 | Tseng et al. | |
| 2014/0132437 A1 | 5/2014 | Danjo | |
| 2019/0334514 A1* | 10/2019 | Xu | H03K 5/22 |

\* cited by examiner

|  | [1] | [2] | [3] | Proposed |
|---|---|---|---|---|
| Delay sensitivity, ps/dec | 47.6 | 60 | 48.3 | 41 |
| Offset, mV | 6.5 | 5.3 | 5.4 | 5.3 |
| Power consumption @$\Delta Vin$=1mV, mW | 0.455 | 0.292 | 0.286 | 0.295 |

HIGH-SPEED AND LOW-NOISE DYNAMIC COMPARATOR

CROSS REFERENCES TO RELATED APPLICATIONS

This is a Sect. 371 National Stage of PCT International Application No. PCT/CN2018/096084, filed on 18 Jul. 2018, which claims priority of a Chinese Patent Application No. 201810239481X filed on 22 Mar. 2018, the contents of both applications hereby being incorporated by reference in their entireties for all purposes.

BACKGROUND OF THE PRESENT DISCLOSURE

Field of Disclosure

The present disclosure relates to the field of electronic technologies, and in particular to a high-speed and low-noise dynamic comparator.

Description of Related Arts

In recent years, a comparator serves as a core component of an analog-to-digital converter, and the performance of the comparator becomes a bottleneck in high-speed and low-power-consumption design. It is difficult for several conventional comparator structures to meet requirements for speeds, power consumption, low power supply voltages, noise, and the like at the same time.

At present, a high-speed low-noise dynamic comparator has many structures. For example, the principle of a latching structure is used to enable a comparator to quickly enter a latching state, but the structure has great static power consumption. In addition, in some low-power-consumption dynamic comparator structures, when an input transistor is in a saturated state, a feedback technology is generally used, so that after the comparator completes one comparison, a tail current transistor is turned off, so that power consumption of the comparator is low. However, this structure has a disadvantage in that if the speed of the comparator is further increased, only the size of the input transistor can be increased, which increases a parasitic capacitance of an input end of the comparator. Currently, conventional comparator structures do not change contradiction between the comparison speed and noise of the comparator, that is, equivalent input noise of the comparator increases as the speed of the comparator increases. If the equivalent input noise of the comparator is to be reduced, it is necessary to reduce the speed of the comparator.

SUMMARY OF THE PRESENT DISCLOSURE

The present disclosure provides a high-speed and low-noise dynamic comparator, to resolve the foregoing technical problems.

The high-speed and low-noise dynamic comparator provided in the present disclosure includes: an input unit, a latch unit, a pull-up unit, a pull-down unit, a first signal control end, a second signal control end, and a substrate bootstrap voltage generation circuit.

The input unit includes an input NMOS transistor and an input PMOS transistor.

The latch unit includes a latching NMOS transistor and a latching PMOS transistor, the latching NMOS transistor and the latching PMOS transistor are connected to form a latch structure.

The pull-up unit is coupled with the input unit and the latch unit, and includes a pull-up PMOS transistor connected to the input NMOS transistor.

The pull-down unit is coupled with the input unit and includes a pull-down NMOS transistor connected to the input PMOS transistor.

The first signal control end generates a first control signal.

The second signal control end is connected with the pull-up unit and generates a second control signal.

The substrate bootstrap voltage generation circuit is connected with the first signal control end and generates a substrate bootstrap voltage and including a first bootstrap voltage generation circuit connected to an NMOS transistor substrate and a second bootstrap voltage generation circuit connected to a PMOS transistor substrate.

Further, the first bootstrap voltage generation circuit includes a bootstrap voltage NMOS transistor and a first capacitor, and the second bootstrap voltage generation circuit includes a bootstrap voltage PMOS transistor and a second capacitor; a gate of the bootstrap voltage NMOS transistor is connected to a reverse signal end of the first control signal, a drain of the bootstrap voltage NMOS transistor is connected to the first signal control end through the first capacitor, and a source of the bootstrap voltage NMOS transistor is grounded; a gate of the bootstrap voltage PMOS transistor is connected to the first signal control end, a source of the bootstrap voltage PMOS transistor is connected to a power source, and a drain of the bootstrap voltage PMOS transistor is connected to the reverse signal end of the first control signal through the second capacitor.

The pull-up PMOS transistor includes a first pull-up PMOS transistor, a second pull-up PMOS transistor, and a third pull-up PMOS transistor.

A gate of the first pull-up PMOS transistor is connected to the second signal control end, a source of the first pull-up PMOS transistor is connected to a power source VDD, and a drain of the first pull-up PMOS transistor is connected to the latch unit; a gate of the second pull-up PMOS transistor is connected to the second signal control end, a source of the second pull-up PMOS transistor is connected to the power source VDD, and a drain of the second pull-up PMOS transistor is connected to the latch unit; a gate of the third pull-up PMOS transistor is connected to a reverse signal end of the second signal control end, a source of the third pull-up PMOS transistor is connected to the power source VDD, and a drain of the third pull-up PMOS transistor is connected to the latch unit;

When the comparator is in a reset state, the first control signal and the second control signal are low level signals, substrate voltages of all the NMOS transistors are 0, substrate voltages of all the PMOS transistors are 1, a voltage at two ends of the first capacitor is 0, and a voltage at two ends of the second capacitor is 1.

When the comparator is in a comparison state, a substrate voltage of the input NMOS transistor and a substrate voltage of the pull-down NMOS transistor are coupled to a high potential, and a substrate voltage of the input PMOS transistor and a substrate voltage of the third pull-up PMOS transistor are coupled to a low potential.

Further, the pull-down NMOS transistor includes a first pull-down NMOS transistor, the latching NMOS transistor includes a first latching NMOS transistor and a second latching NMOS transistor, the latching PMOS transistor includes a first latching PMOS transistor and a second latching PMOS transistor, a gate of the first latching NMOS transistor is separately connected to a gate of the first latching PMOS transistor, a drain of the second latching PMOS transistor, and a drain of the second latching NMOS transistor, a gate of the second latching NMOS transistor is separately connected to a gate of the second latching PMOS transistor, a drain of the first latching PMOS transistor, and a drain of the first latching NMOS transistor, a source of the first latching NMOS transistor, a source of the second latching NMOS transistor, and a drain of the first pull-down NMOS transistor are connected to each other, the drain of the first pull-down NMOS transistor is separately connected to the source of the first latching NMOS transistor and the source of the second latching NMOS transistor, the drain of the first pull-down NMOS transistor is grounded, and a source of the first latching PMOS transistor, a source of the second latching PMOS transistor, and a drain of the third pull-up PMOS transistor are connected to each other.

The high-speed and low-noise dynamic comparator further includes a delay unit, the input NMOS transistor includes a first input NMOS transistor and a second input NMOS transistor, the input PMOS transistor includes a first input PMOS transistor and a second input PMOS transistor, the pull-down NMOS transistor further includes a second pull-down NMOS transistor, a source of the first input NMOS transistor, a source of the second input NMOS transistor, and a drain of the second pull-down NMOS transistor are connected to each other, a source of the second pull-down NMOS transistor is grounded, a voltage signal DP and a voltage signal DN are respectively connected to two input ends of an XNOR gate, an output end of the XNOR gate and a first control signal are respectively connected to two input ends of an AND gate, and an output end of the AND gate is separately connected to a gate of the second pull-down NMOS transistor and an input end of the delay unit.

Further, the input PMOS transistor includes the first input PMOS transistor and the second input PMOS transistor, a gate of the first input PMOS transistor is connected to a voltage input end VIP, a source of the first input PMOS transistor is connected to the source of the first latching PMOS transistor, a drain of the first input PMOS transistor is separately connected to the drain of the first latching PMOS transistor, the drain of the first pull-up PMOS transistor, the drain of the first latching NMOS transistor, the gate of the second latching NMOS transistor, the gate of the second latching PMOS transistor, and a drain of the first input NMOS transistor, and the drain of the first input PMOS transistor is further connected to a reverse signal end of the voltage signal DP.

A gate of the second input PMOS transistor is connected to a voltage input end VIN, a source of the second input PMOS transistor is connected to the source of the second latching PMOS transistor, a drain of the second input PMOS transistor is separately connected to the drain of the second latching PMOS transistor, the drain of the second pull-up PMOS transistor, the gate of the first latching NMOS transistor, the gate of the first latching PMOS transistor, and a drain of the second input NMOS transistor, and the drain of the second input PMOS transistor is further connected to a reverse signal end of the voltage signal DN.

Further, the first bootstrap voltage generation circuit is separately connected to a substrate of the first input NMOS transistor, a substrate of the second input NMOS transistor, and a substrate of the second pull-down NMOS transistor, and the second bootstrap voltage generation circuit is separately connected to a substrate of the third pull-up PMOS transistor, a substrate of the first input PMOS transistor, a substrate of the second input PMOS transistor, and a substrate of the first pull-down NMOS transistor.

Further, when the comparator is in a comparison state, the first control signal and the second control signal are 1, the first pull-down NMOS transistor, the second pull-down NMOS transistor, and the third pull-up PMOS transistor are turned on, the first pull-up PMOS transistor and the second pull-up PMOS transistor are turned off, the bootstrap voltage NMOS transistor and the bootstrap voltage PMOS transistor are turned off, a first bootstrap voltage generated by the first bootstrap voltage generation circuit is coupled by the first capacitor to a high potential, and a second bootstrap voltage generated by the second bootstrap voltage generation circuit is coupled by the second capacitor to a low potential, further, the substrate voltages of the first input NMOS transistor, the second input NMOS transistor, the first pull-down NMOS transistor, and the second pull-down NMOS transistor are coupled to a high potential, and the substrate voltages of the first input PMOS transistor, the second input PMOS transistor, and the third pull-up PMOS transistor are coupled to a low potential.

Beneficial effects of the present disclosure are: in the high-speed and low-noise dynamic comparator, by using a substrate bootstrap technology in which MOS transistors are used, compared with a conventional technology, on resistances of the MOS transistors are reduced, the comparator speed of the comparator is increased, and by using a signal input technology of a mixed structure in which NMOS transistors and PMOS transistors are used at the same time, compared with the conventional technology, a signal path is added, further improving the comparator speed of the comparator. In addition, since the substrate bootstrap technology is used, threshold voltages of input transistors of the comparator are reduced, so that transconductance of the input transistors is increased, thereby reducing equivalent input noise of the comparator, and by using a complementary input structure, as a common-mode voltage of the comparator changes, a comparison delay of the comparator changes relatively little.

DETAILED DESCRIPTION OF THE PREFERRED EMBODIMENTS

The implementation mode of the present disclosure will be described below through specific embodiments. Those skilled in the art can easily understand other advantages and effects of the present disclosure according to contents disclosed by the specification. The present disclosure can also be implemented or applied through other different specific implementation modes. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complex.

Figure 1:
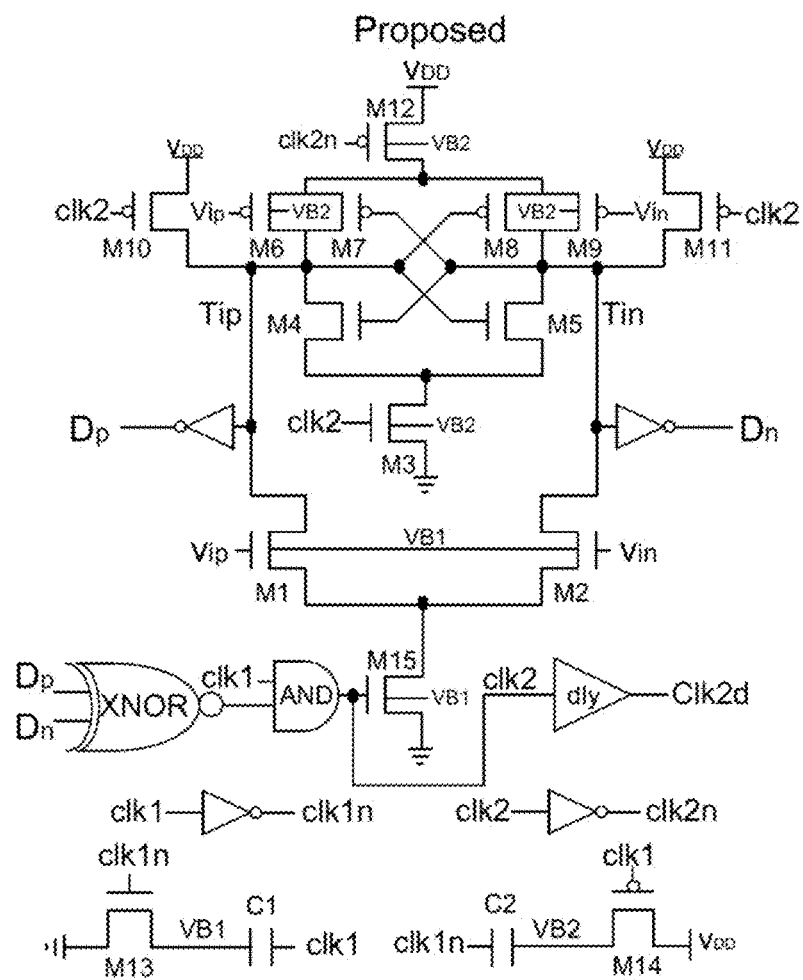
FIG. 1 is a schematic principle diagram of a high-speed and low-noise dynamic comparator according to an embodiment of the present disclosure.

As shown in FIG. 1, the high-speed and low-noise dynamic comparator in this embodiment includes: an input unit, a latch unit, a pull-up unit, a pull-down unit, a first signal control end, a second signal control end, and a substrate bootstrap voltage generation circuit.

The input unit includes an input NMOS transistor and an input PMOS transistor.

The latch unit includes a latching NMOS transistor and a latching PMOS transistor, the latching NMOS transistor and the latching PMOS transistor are connected to form a latch structure.

The pull-up unit is coupled with the input unit and the latch unit, and includes a pull-up PMOS transistor connected to the input NMOS transistor.

The pull-down unit is coupled with the input unit, and includes a pull-down NMOS transistor connected to the input PMOS transistor.

The first signal control end generates a first control signal.

The second signal control end is connected with the pull-up unit and generates a second control signal.

The substrate bootstrap voltage generation circuit is connected with the first signal control end and generates a substrate bootstrap voltage and including a first bootstrap voltage generation circuit connected to an NMOS transistor substrate and a second bootstrap voltage generation circuit connected to a PMOS transistor substrate.

In the high-speed and low-noise dynamic comparator according to this embodiment, by using a substrate coupling technology, threshold voltages of the input unit and the pull-down unit are reduced, so that on resistances of the input unit and the pull-down unit are reduced, so that a comparison speed of the comparator is improved. On the other hand, in a comparator input structure of the present disclosure, the NMOS transistors and PMOS transistors are used at the same time, and a signal path is added compared with a conventional structure in which NMOS transistors or PMOS transistors are used alone, thereby further improving the comparison speed of the comparator in this structure. In addition, in such a mixed input structure of NMOS and PMOS, a phenomenon in which voltage fluctuation at a point Tip and a point Tin is coupled to input ends Vip and Vin through a gate/drain capacitor of an input transistor is well suppressed, so that in a comparator process, voltage fluctuations at the input ends Vip and Vin are suppressed.

In this embodiment, the input NMOS transistor can be a first input NMOS transistor M1 and/or a second input NMOS transistor M2. The input PMOS transistor can be a first input PMOS transistor M6 and/or a second input PMOS transistor M9. The latching NMOS transistor can be a first latching NMOS transistor M4 and/or a second latching NMOS transistor M5, and the latching PMOS transistor can be a first latching PMOS transistor M7 and/or a second latching PMOS transistor M8. The pull-up PMOS transistor can be a first pull-up PMOS transistor M10, a second pull-up PMOS transistor M11, and/or a third pull-up PMOS transistor M12. The pull-down NMOS transistor can be a first pull-down NMOS transistor M3 and/or a second pull-down NMOS transistor M15. In the comparator according to this embodiment, by using a substrate bootstrap technology, threshold voltages of the first input NMOS transistor M1, the second input NMOS transistor M2, the first input PMOS transistor M6, and the second input PMOS transistor M9 of the comparator are reduced, so that transconductance of M1, M2, M6, and M9 is increased, thereby reducing equivalent input noise of the comparator.

In this embodiment, the first bootstrap voltage generation circuit includes a bootstrap voltage NMOS transistor M13 and a first capacitor C1, and the second bootstrap voltage generation circuit includes a bootstrap voltage PMOS transistor M14 and a second capacitor C2; a gate of the bootstrap voltage NMOS transistor M13 is connected to a reverse signal end of the first control signal, a drain of the bootstrap voltage NMOS transistor M13 is connected to the first signal control end through the first capacitor, and a source of the bootstrap voltage NMOS transistor M13 is grounded; a gate of the bootstrap voltage PMOS transistor M14 is connected to the first signal control end, a source of the bootstrap voltage PMOS transistor M14 is connected to a power source, and a drain of the bootstrap voltage PMOS transistor M14 is connected to the reverse signal end of the first control signal through the second capacitor.

In this embodiment, a gate of the first pull-up PMOS transistor M10 is connected to the second signal control end, a source of the first pull-up PMOS transistor M10 is connected to a power source VDD, and a drain of the first pull-up PMOS transistor M10 is connected to the latch unit; a gate of the second pull-up PMOS transistor M11 is connected to the second signal control end, a source of the second pull-up PMOS transistor M11 is connected to the power source VDD, and a drain of the second pull-up PMOS transistor M11 is connected to the latch unit; a gate of the third pull-up PMOS transistor M12 is connected to a reverse signal end of the second signal control end, a source of the third pull-up PMOS transistor M12 is connected to the power source VDD, and a drain of the third pull-up PMOS transistor M12 is connected to the latch unit.

In this embodiment, a gate of the first latching NMOS transistor M4 is separately connected to a gate of the first latching PMOS transistor M7, a drain of the second latching PMOS transistor M8, and a drain of the second latching NMOS transistor M5, a gate of the second latching NMOS transistor M5 is separately connected to a gate of the second latching PMOS transistor M8, a drain of the first latching PMOS transistor M7, and a drain of the first latching NMOS transistor M4, a source of the first latching NMOS transistor M4, a source of the second latching NMOS transistor M8, and a drain of the first pull-down NMOS transistor M3 are connected to each other, the drain of the first pull-down NMOS transistor M3 is separately connected to the source of the first latching NMOS transistor M4 and the source of the second latching NMOS transistor M5, the drain of the first pull-down NMOS transistor M3 is grounded, and a source of the first latching PMOS transistor M7, a source of the second latching PMOS transistor M8, and a drain of the third pull-up PMOS transistor M12 are connected to each other.

In this embodiment, the high-speed and low-noise dynamic comparator further includes a delay unit "dly", a source of the first input NMOS transistor M1, a source of the second input NMOS transistor M2, and a drain of the second pull-down NMOS transistor M15 are connected to each other, a source of the second pull-down NMOS transistor M15 is grounded, a voltage signal DP and a voltage signal DN are respectively connected to two input ends of an XNOR gate, an output end of the XNOR gate and a first control signal clk1 are respectively connected to two input ends of an AND gate, and an output end of the AND gate is separately connected to a gate of the second pull-down NMOS transistor M15 and an input end of the delay unit "dly".

A gate of the first input PMOS transistor M6 is connected to a voltage input end VIP, a source of the first input PMOS transistor M6 is connected to the source of the first latching PMOS transistor, a drain of the first input PMOS transistor M6 is separately connected to the drain of the first latching PMOS transistor, the drain of the first pull-up PMOS transistor M10, the drain of the first latching NMOS transistor M4, the gate of the second latching NMOS transistor M5, the gate of the second latching PMOS transistor M8, and a drain of the first input NMOS transistor M1, and the drain of the first input PMOS transistor M6 is further connected to a reverse signal end of the voltage signal DP.

A gate of the second input PMOS transistor M9 is connected to a voltage input end VIN, a source of the second input PMOS transistor M9 is connected to the source of the second latching PMOS transistor M8, a drain of the second input PMOS transistor M9 is separately connected to the drain of the second latching PMOS transistor M8, the drain of the second pull-up PMOS transistor M11, the gate of the first latching NMOS transistor M4, the gate of the first latching PMOS transistor M7, and a drain of the second input NMOS transistor M2, and the drain of the second input PMOS transistor M9 is further connected to a reverse signal end of the voltage signal DN.

The first bootstrap voltage generation circuit is separately connected to a substrate of the first input NMOS transistor M1, a substrate of the second input NMOS transistor M2, and a substrate of the second pull-down NMOS transistor M15, and the second bootstrap voltage generation circuit is separately connected to a substrate of the third pull-up PMOS transistor M12, a substrate of the first input PMOS transistor M6, a substrate of the second input PMOS transistor M9, and a substrate of the first pull-down NMOS transistor M3.

In this embodiment, the comparator has two working states, one being a reset state and the other being a comparator state. When the comparator is in a reset state, the first control signal clk1 and the second control signal clk2 are both 0, and a reverse signal clk1n of the first control signal is 1. In this case, substrate voltages of all the NMOS transistors are all 0, substrate voltages of all the PMOS transistors are all 1. The NMOS transistors M3 and M15 are turned off, the PMOS transistor M12 is also turned off, and the PMOS transistors M10 and M11 are turned on. Therefore, voltages at points Tip and Tin are respectively pulled up to 1 by the first pull-up PMOS transistor M10 and the second pull-up PMOS transistor M11. NMOS transistor M13 and the PMOS transistor M14 are turned on, voltages at two ends of the first capacitor C1 are both 0, and voltages at two ends of the second capacitor C2 are both 1. When the comparator is in a comparison state, the first control signal clk1 and the second control signal clk2 change from 0 to 1, and the signal clk1n changes from 1 to 0. In this case, M15, M12, and M3 are turned on, M10 and M11 are turned off, and voltages at points Tip and Tin start to be pulled down. In addition, M13 and M14 are also turned off, a voltage of VB1 is coupled by C1 to a high potential, and a voltage of VB2 is coupled by C2 to a low potential. Substrate voltages of the NMOS transistors M1, M2, M3, and M15 are coupled to a high potential, and substrate voltages of PMOS transistors M6, M9, and M12 are coupled to a low potential.

By using the above substrate coupling technology, threshold voltages of the first input NMOS transistor M1, the second input NMOS transistor M2, the first pull-down NMOS transistor M3, the second pull-down NMOS transistor M15, the first input PMOS transistor M6, the second input PMOS transistor M9, and the third pull-up PMOS transistor M12 are reduced, so that on resistances thereof are reduced, so that a comparison speed of the comparator is improved. In this embodiment, by using a complementary input structure, as a common-mode voltage of the comparator changes, a comparison delay of the comparator changes relatively little.

To further verify the foregoing advantages of the present disclosure, a specific embodiment is listed below:

In a 65 nm CMOS process, the structure in this embodiment and three other conventional structures are designed, the foregoing four structures have the same input/output transistor sizes, latch structures also have the same size, and load capacitors are all 15 fF.

In this embodiment, when the comparator starts comparison, voltages at points Tip and Tin are pulled down from a source voltage. Therefore, compared with a conventional structure, the additionally added PMOS transistor M12 does not affect a comparison speed of the whole comparator. The bootstrap voltage NMOS transistor M13, the bootstrap voltage PMOS transistor M14, the first capacitor C1, and the second capacitor C2 are designed to have small sizes, and a substrate voltage bootstrap technology is used, so that delay and noise of the comparator can be reduced at the same time, and a substrate drain current is maintained at a very small value. In this embodiment, sizes of both the bootstrap voltage NMOS transistor M13 and the bootstrap voltage PMOS transistor M14 are set to 120 nm/60 nm, the first capacitor C1 and the second capacitor C2 are both 2 fF, power consumption generated by the substrate bootstrap technology is less than 10 μW, which is a value that can be almost ignored for power consumption of the whole comparator.

Figure 2:
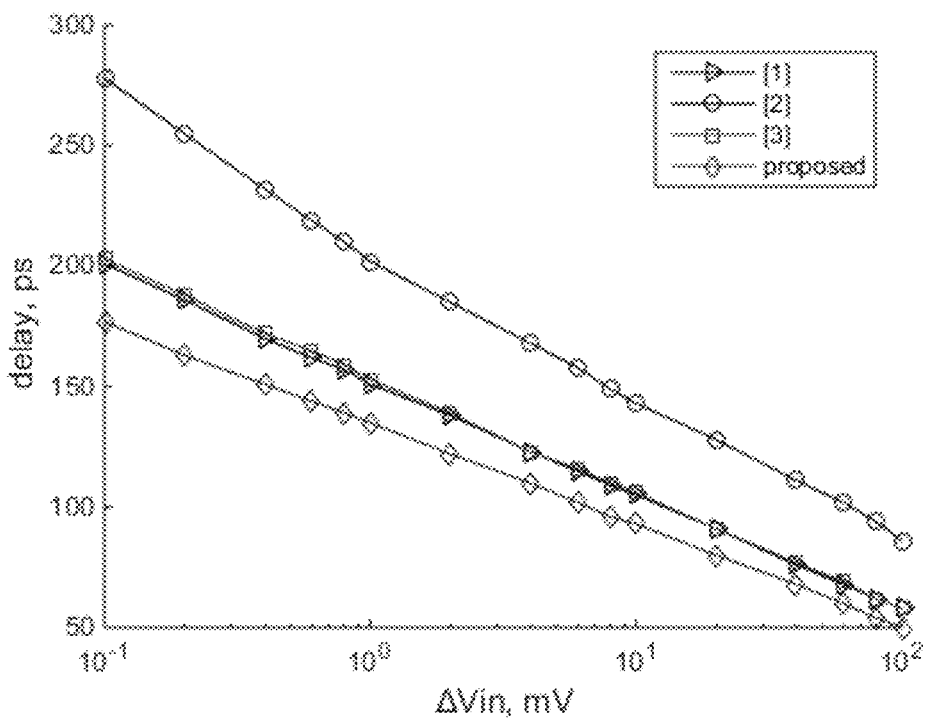
FIG. 2 is a schematic diagram of comparison of change of a comparison delay of a comparator as an input signal changes according to an embodiment of the present disclosure.

A clock frequency is 1.8 GHz, the source voltage is 1.2V, and the common-mode voltage is 0.6V. When |Dp−Dn|=0.6V, the comparator is considered to complete comparison. A comparison curve of change of comparison time of the comparators of the foregoing four structures as an input differential signal ΔVin changes is shown in FIG. 2, and compared with three other conventional structures, the comparison speed in this embodiment is improved.

Figure 3:
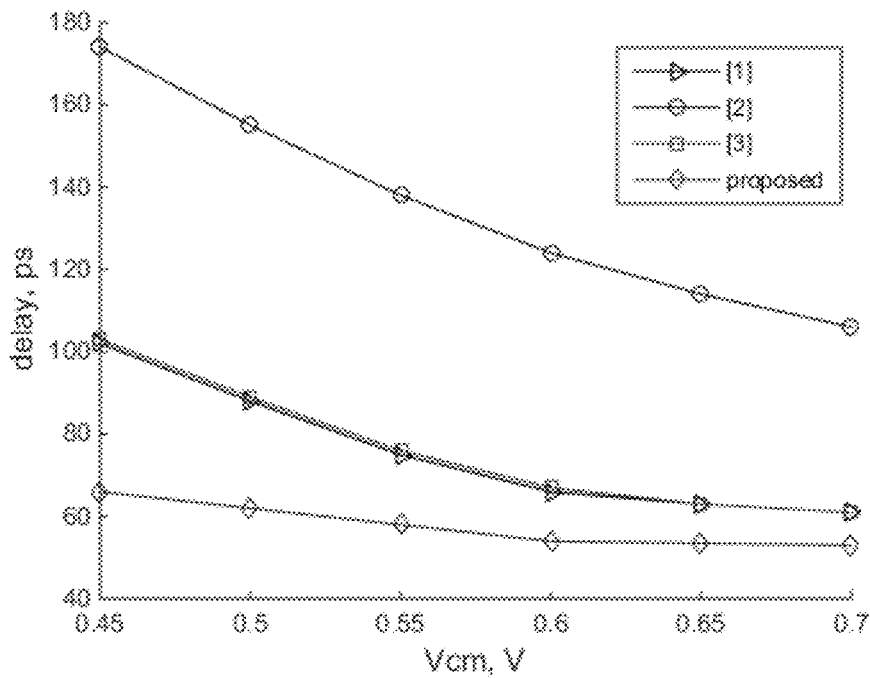
FIG. 3 is a schematic diagram of comparison of change of a comparison delay of a comparator as a common-mode voltage changes according to an embodiment of the present disclosure.

The clock frequency is 1.8 GHz, and the source voltage is 1.2V. When |Dp−Dn|=0.6V, the comparator is considered to complete comparison. A comparison curve of change of a comparison delay of the comparator as the common-mode voltage Vcm changes is shown in FIG. 3. As the common-mode voltage decreases from 0.7V to 0.45V, the comparison delay in this embodiment is increased only by 21.5%, and the value is 64.5-68 for a conventional structure. Therefore, the comparison delay is reduced.

Figures 4, 5:
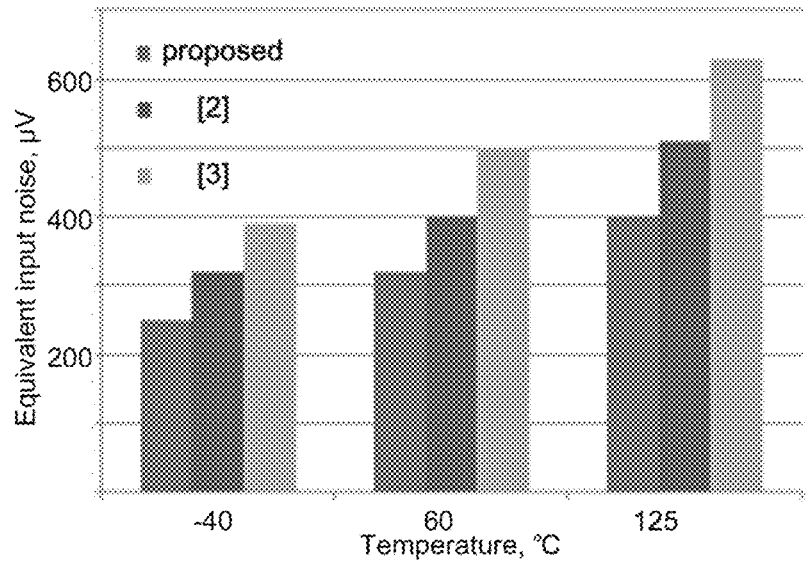
FIG. 4 is a schematic diagram of comparison of change of equivalent input noise of a comparator as a temperature changes according to an embodiment of the present disclosure.
FIG. 5 is a schematic diagram of comparison of simulation results of several other indexes of a comparator according to an embodiment of the present disclosure.

The clock frequency is 1.8 GHz, the input differential voltage ΔVin is 50 mV, and the source voltage is 1.2V. When |Dp−Dn|=0.6V, the comparator is considered to complete comparison. A comparison diagram of change of equivalent input noise of comparators of the foregoing four structures as the temperature changes is shown in FIG. 4. Compared with a conventional structure, the equivalent input noise in the present disclosure is reduced by at least 25% to 38%.

Simulation results of several other indexes of the comparators are shown in FIG. 5. It can be seen from FIG. 5 that in the present disclosure, compared with several conventional structures, power consumption is also at a relatively low level, and an misalignment voltage is at a medium level.

It can be seen from the foregoing simulation results that in the high-speed and low-power-consumption comparator structure provided in the present disclosure, compared with several conventional structures, in a case of equal power consumption, the speed is increased by at least 20%, and the equivalent input noise is reduced by at least 25%.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A high-speed and low-noise dynamic comparator, comprising:
    an input unit, comprising an input NMOS transistor and an input PMOS transistor;
    a latch unit, comprising a latching NMOS transistor and a latching PMOS transistor, wherein the latching NMOS transistor and the latching PMOS transistor are connected to form a latch structure;
    a pull-up unit coupled with the input unit and the latch unit, comprising a pull-up PMOS transistor connected to the input NMOS transistor;
    a pull-down unit coupled with the input unit, comprising a pull-down NMOS transistor connected to the input PMOS transistor;
    a first signal control end, for generating a first control signal;
    a second signal control end connected with the pull-up unit, for generating a second control signal; and
    a substrate bootstrap voltage generation circuit connected with the first signal control end, for generating a substrate bootstrap voltage and comprising a first bootstrap voltage generation circuit connected to an NMOS transistor substrate and a second bootstrap voltage generation circuit connected to a PMOS transistor substrate;
    wherein the first bootstrap voltage generation circuit comprises a bootstrap voltage NMOS transistor and a first capacitor, wherein
        a gate of the bootstrap voltage NMOS transistor is connected to a reverse signal end of the first control signal,
        a drain of the bootstrap voltage NMOS transistor is connected to the first signal control end through the first capacitor, and
        a source of the bootstrap voltage NMOS transistor is grounded;
    the second bootstrap voltage generation circuit comprises a bootstrap voltage PMOS transistor and a second capacitor, wherein
        a gate of the bootstrap voltage PMOS transistor is connected to the first signal control end,
        a source of the bootstrap voltage PMOS transistor is connected to a power source, and
        a drain of the bootstrap voltage PMOS transistor is connected to the reverse signal end of the first control signal through the second capacitor;
    the pull-up PMOS transistor comprises a first pull-up PMOS transistor, a second pull-up PMOS transistor, and a third pull-up PMOS transistor, wherein
        a gate of the first pull-up PMOS transistor is connected to the second signal control end,
        a source of the first pull-up PMOS transistor is connected to a power source VDD,
        a drain of the first pull-up PMOS transistor is connected to the latch unit;
        a gate of the second pull-up PMOS transistor is connected to the second signal control end,
        a source of the second pull-up PMOS transistor is connected to the power source VDD,
        a drain of the second pull-up PMOS transistor is connected to the latch unit,
        a gate of the third pull-up PMOS transistor is connected to a reverse signal end of the second signal control end,
        a source of the third pull-up PMOS transistor is connected to the power source VDD, and
        a drain of the third pull-up PMOS transistor is connected to the latch unit;
    when the comparator is in a reset state,
        the first control signal and the second control signal are low level signals,
        substrate voltages of all NMOS transistors are 0,
        substrate voltages of all PMOS transistors are 1,
        a voltage at two ends of the first capacitor is 0, and
        a voltage at two ends of the second capacitor is 1; and
    when the comparator is in a comparison state,
        a substrate voltage of the input NMOS transistor and a substrate voltage of the pull-down NMOS transistor are coupled to a high potential, and
        a substrate voltage of the input PMOS transistor and a substrate voltage of the third pull-up PMOS transistor are coupled to a low potential.

2. The high-speed and low-noise dynamic comparator as in claim 1, wherein
    the pull-down NMOS transistor comprises a first pull-down NMOS transistor;
    the latching NMOS transistor comprises a first latching NMOS transistor and a second latching NMOS transistor;
    the latching PMOS transistor comprises a first latching PMOS transistor and a second latching PMOS transistor;
    a gate of the first latching NMOS transistor is separately connected to a gate of the first latching PMOS transistor, a drain of the second latching PMOS transistor, and a drain of the second latching NMOS transistor;
    a gate of the second latching NMOS transistor is separately connected to a gate of the second latching PMOS transistor, a drain of the first latching PMOS transistor, and a drain of the first latching NMOS transistor;
    a source of the first latching NMOS transistor, a source of the second latching NMOS transistor, and a drain of the first pull-down NMOS transistor are connected to each other;

the drain of the first pull-down NMOS transistor is separately connected to the source of the first latching NMOS transistor and the source of the second latching NMOS transistor, the drain of the first pull-down NMOS transistor is grounded; and a source of the first latching PMOS transistor, a source of the second latching PMOS transistor, and a drain of the third pull-up PMOS transistor are connected to each other.

3. The high-speed and low-noise dynamic comparator as in claim 2, further comprising a delay unit, wherein the input NMOS transistor comprises a first input NMOS transistor and a second input NMOS transistor;

the input PMOS transistor comprises a first input PMOS transistor and a second input PMOS transistor;

the pull-down NMOS transistor further comprises a second pull-down NMOS transistor;

a source of the first input NMOS transistor, a source of the second input NMOS transistor, and a drain of the second pull-down NMOS transistor are connected to each other;

a source of the second pull-down NMOS transistor is grounded;

a voltage signal DP and a voltage signal DN are respectively connected to two input ends of an XNOR gate;

an output end of the XNOR gate and a first control signal are respectively connected to two input ends of an AND gate; and an output end of the AND gate is separately connected to a gate of the second pull-down NMOS transistor and an input end of the delay unit.

4. The high-speed and low-noise dynamic comparator as in claim 3, wherein the input PMOS transistor comprises the first input PMOS transistor and the second input PMOS transistor, wherein a gate of the first input PMOS transistor is connected to a voltage input end VIP;

a source of the first input PMOS transistor is connected to the source of the first latching PMOS transistor;

a drain of the first input PMOS transistor is separately connected to the drain of the first latching PMOS transistor, the drain of the first pull-up PMOS transistor, the drain of the first latching NMOS transistor, the gate of the second latching NMOS transistor, the gate of the second latching PMOS transistor, and a drain of the first input NMOS transistor;

the drain of the first input PMOS transistor is further connected to a reverse signal end of the voltage signal DP;

a gate of the second input PMOS transistor is connected to a voltage input end VIN;

a source of the second input PMOS transistor is connected to the source of the second latching PMOS transistor;

a drain of the second input PMOS transistor is separately connected to the drain of the second latching PMOS transistor, the drain of the second pull-up PMOS transistor, the gate of the first latching NMOS transistor, the gate of the first latching PMOS transistor, and a drain of the second input NMOS transistor; and the drain of the second input PMOS transistor is further connected to a reverse signal end of the voltage signal DN.

5. The high-speed and low-noise dynamic comparator as in claim 4, wherein the first bootstrap voltage generation circuit is separately connected to a substrate of the first input NMOS transistor, a substrate of the second input NMOS transistor, and a substrate of the second pull-down NMOS transistor; and the second bootstrap voltage generation circuit is separately connected to a substrate of the third pull-up PMOS transistor, a substrate of the first input PMOS transistor, a substrate of the second input PMOS transistor, and a substrate of the first pull-down NMOS transistor.

6. The high-speed and low-noise dynamic comparator as in claim 5, wherein when the comparator is in a comparison state, the first control signal and the second control signal are 1;

the first pull-down NMOS transistor, the second pull-down NMOS transistor, and the third pull-up PMOS transistor are turned on;

the first pull-up PMOS transistor and the second pull-up PMOS transistor are turned off;

the bootstrap voltage NMOS transistor and the bootstrap voltage PMOS transistor are turned off;

a first bootstrap voltage generated by the first bootstrap voltage generation circuit is coupled by the first capacitor to a high potential;

a second bootstrap voltage generated by the second bootstrap voltage generation circuit is coupled by the second capacitor to a low potential;

the substrate voltages of the first input NMOS transistor, the second input NMOS transistor, the first pull-down NMOS transistor, and the second pull-down NMOS transistor are coupled to a high potential; and the substrate voltages of the first input PMOS transistor, the second input PMOS transistor, and the third pull-up PMOS transistor are coupled to a low potential.

* * * * *